US 9,985,151 B2

(12) United States Patent
Hoeppel et al.

(10) Patent No.: US 9,985,151 B2
(45) Date of Patent: May 29, 2018

(54) COMPONENT AND METHOD FOR PRODUCING A COMPONENT

(71) Applicant: OSRAM Opto Semiconductors GmbH, Regensburg (DE)

(72) Inventors: Lutz Hoeppel, Alteglofsheim (DE); Norwin von Malm, Thumhausen/Nittendorf (DE)

(73) Assignee: OSRAM OPTO Semiconductors GmbH, Regensburg (DE)

( * ) Notice: Subject to any disclaimer, the term of this patent is extended or adjusted under 35 U.S.C. 154(b) by 0 days. days.

(21) Appl. No.: 15/528,106

(22) PCT Filed: Oct. 14, 2015

(86) PCT No.: PCT/EP2015/073795
§ 371 (c)(1),
(2) Date: May 19, 2017

(87) PCT Pub. No.: WO2016/078837
PCT Pub. Date: May 26, 2016

(65) Prior Publication Data
US 2017/0330981 A1 Nov. 16, 2017

(30) Foreign Application Priority Data
Nov. 19, 2014 (DE) .................. 10 2014 116 935

(51) Int. Cl.
*H01L 27/14* (2006.01)
*H01L 31/0236* (2006.01)
(Continued)

(52) U.S. Cl.
CPC ........ *H01L 31/0236* (2013.01); *H01L 23/481* (2013.01); *H01L 23/49582* (2013.01);
(Continued)

(58) Field of Classification Search
CPC ............. H01L 23/49827; H01L 23/481; H01L 23/49582; H01L 23/49586; H01L 31/101; H01L 31/0236
See application file for complete search history.

(56) References Cited

U.S. PATENT DOCUMENTS

| 2010/0171135 A1 | 7/2010 | Engl et al. |
| 2013/0187192 A1 | 7/2013 | Hoeppel |

(Continued)

FOREIGN PATENT DOCUMENTS

| DE | 102007019775 A1 | 10/2008 |
| DE | 102007022947 A1 | 10/2008 |

(Continued)

OTHER PUBLICATIONS

German Search Report based on application No. 10 2014 116 935.2 (9 pages) dated Aug. 12, 2015 (for reference purpose only).

(Continued)

*Primary Examiner* — Thanh Y Tran
(74) *Attorney, Agent, or Firm* — Viering Jentschura & Partner MBB

(57) ABSTRACT

A component with a semiconductor body, and first and second metal layer is disclosed. The first metal layer is arranged between the semiconductor body and the second metal layer, the semiconductor body has a first semiconductor layer on a side which is averted from the first metal layer, a second semiconductor layer on a side facing towards the first metal layer, and an active layer arranged between the first semiconductor layer and the second semiconductor layer, the component has a through-connection, which extends through the second semiconductor layer and the active layer for the electrical bonding of the first semiconductor layer. The second metal layer has a first subregion electrically connected to the through-connection by the first metal layer, and a second subregion spaced apart laterally (Continued)

from the first subregion by an intermediate space. In an overhead view, the first metal layer laterally completely covers the intermediate space.

21 Claims, 2 Drawing Sheets

(51) Int. Cl.
    *H01L 23/495* (2006.01)
    *H01L 31/101* (2006.01)
    *H01L 23/48* (2006.01)
    *H01L 23/498* (2006.01)

(52) U.S. Cl.
    CPC .. *H01L 23/49586* (2013.01); *H01L 23/49827* (2013.01); *H01L 31/101* (2013.01)

(56) References Cited

U.S. PATENT DOCUMENTS

| | | | |
|---|---|---|---|
| 2013/0207154 A1 | 8/2013 | Hoeppel | |
| 2014/0306261 A1* | 10/2014 | Im | H01L 33/62 257/99 |
| 2015/0255685 A1 | 9/2015 | Herrmann et al. | |
| 2015/0270446 A1 | 9/2015 | Neumann | |
| 2016/0111615 A1* | 4/2016 | von Malm | H01L 33/382 257/98 |
| 2016/0336307 A1* | 11/2016 | Herrmann | H01L 23/49822 |
| 2017/0084777 A1* | 3/2017 | Pfeuffer | H01L 33/0079 |

FOREIGN PATENT DOCUMENTS

| | | |
|---|---|---|
| DE | 102010025320 A1 | 12/2011 |
| DE | 102010027679 A1 | 1/2012 |
| DE | 102012106953 A1 | 1/2014 |
| DE | 102012217533 A1 | 3/2014 |

OTHER PUBLICATIONS

International Search Report based on application No. PCT/EP2015/073795 (13 pages) dated Dec. 17, 2015 (for reference purpose only).

* cited by examiner

COMPONENT AND METHOD FOR PRODUCING A COMPONENT

RELATED APPLICATIONS

The present application is a national stage entry according to 35 U.S.C. § 371 of PCT application No.: PCT/EP2015/073795 filed on Oct. 14, 2015, which claims priority from German application No.: 10 2014 116 935.2 filed on Nov. 19, 2014, and is incorporated herein by reference in its entirety.

TECHNICAL FIELD

A component and a method for producing a component are disclosed.

BACKGROUND

One object hereof is the disclosure of a component having high mechanical stability. A cost-effective method is further disclosed for producing such a component.

SUMMARY

According to at least one form of embodiment of a component, the latter includes a semiconductor body having an active layer. Specifically, the active layer is a p-n transition zone. The active layer in this case can be configured as a single layer, or as a layered stack comprised of a plurality of layers. During the operation of the component, the active layer emits, for example, electromagnetic radiation, whether in the visible, ultraviolet or infrared spectral range. Alternatively, the active layer, during the operation of the component, can absorb electromagnetic radiation and convert the latter into electrical signals or electrical energy.

The semiconductor body further includes, for example, a first semiconductor layer of a first conductor carrier type and a second semiconductor layer of a second conductor carrier type, wherein the active layer is specifically arranged between the first semiconductor layer and the second semiconductor layer. For example, the semiconductor body is comprised exclusively of semiconductor layers. The layers of the semiconductor body can be applied in a laminar arrangement to a growth substrate by means of an epidoxy procedure. The growth substrate can then be removed from the semiconductor body, such that the component is specifically devoid of a growth substrate.

The semiconductor body has a first main surface, which is specifically configured as a radiation-permeable surface of the component. The radiation-permeable surface can be structured for the enhancement of the efficiency of radiation decoupling or radiation coupling. Specifically, the first main surface of the semiconductor body is configured as a surface of the first semiconductor layer. The semiconductor body has a second main surface, which is averted from the first main surface and is configured, for example, as a surface of the second semiconductor layer. Specifically, the first main surface and the second main surface delimit the semiconductor body in a vertical direction.

A vertical direction is understood as a direction which is oriented obliquely, and specifically perpendicularly to a main plane of extension of the active layer. For example, the vertical direction is perpendicular to the first and/or the second main surface of the semiconductor body. Conversely, a lateral direction is understood as a direction which runs along, and specifically parallel to the main plane of extension of the active layer. The vertical direction and the lateral direction are advantageously configured in a mutually perpendicular arrangement.

According to at least one form of embodiment of the component, the semiconductor body incorporates at least one recess. The recess extends specifically from the second main surface, through the second semiconductor layer and the active layer to the first semiconductor layer. A recess is understood as an opening in the semiconductor body, which is specifically not configured continuously through the semiconductor body. In other words, the recess forms a blind hole in the semiconductor body which, in the lateral direction, is enclosed by the semiconductor body, specifically over its full perimeter. The semiconductor body may include a plurality of such recesses.

For the configuration of a through-connection, for the electrical bonding of the first semiconductor layer from the side of the second main surface, the recess can be filled with an electrically-conductive material.

According to at least one form of embodiment of the component, the latter has a first metal layer. The first metal layer is arranged, for example, on a side of the semiconductor body facing towards the second main surface. In an overhead view of the semiconductor body, the first metal layer covers the through-connection or the recess, specifically in a complete manner. The first metal layer covers the semiconductor body, for example only partially. For example, the first metal layer is a galvanically-separated metal layer.

According to at least one form of embodiment of the component, the latter has a second metal layer. The first metal layer is at least in some regions arranged between the semiconductor body and the second metal layer. Advantageously, the second metal layer has a first subregion, and a second subregion, spaced apart laterally from the first subregion, wherein the first subregion is electrically connected to the through-connection by means of the first metal layer. In certain places, the first subregion can directly adjoin the first metal layer. The second subregion is specifically electrically isolated from the first subregion. In an overhead view of the semiconductor body, the first metal layer and the second subregion, in combination, cover for example at least 90%, and advantageously at least 95% of the total surface area of the active layer. For example, the second subregion overlaps the first metal layer. The first metal layer and the second subregion can also, in combination, completely cover the entire active layer or the entire semiconductor body.

According to at least one form of embodiment of the component, the latter, in the lateral direction, has an intermediate space between the first subregion and the second subregion of the second metal layer. The intermediate space is partially covered, and advantageously, in an overhead view, entirely covered by the first metal layer. Specifically, the intermediate space and the subregions of the second metal layer are overlaid by the first metal layer over a large surface area. In the lateral direction, the first metal layer specifically projects beyond the second metal layer. For example, the active layer, or the entire semiconductor body, has no point which is not covered by the first metal layer or by the second metal layer, specifically by the second subregion.

In at least one form of embodiment of a component, the latter has a semiconductor body, a first metal layer and a second metal layer, wherein the first metal layer is arranged between the semiconductor body and the second metal layer. The semiconductor body has a first semiconductor layer on a side which is averted from the first metal layer, a second semiconductor layer on a side facing towards the first metal layer, and an active layer arranged between the first semiconductor layer and the second semiconductor layer. The component has a through-connection, which specifically extends in a vertical direction through the second semiconductor layer and the active layer for the electrical bonding of the first semiconductor layer. The second metal layer has a first subregion, and a second subregion, spaced apart laterally from the first subregion by an intermediate space, wherein the first subregion is electrically connected to the through-connection by means of the first metal layer. In an overhead view, the first metal layer laterally completely covers the intermediate space.

Specifically, complete lateral coverage of the intermediate space implies that the first subregion and the second subregion, at points in the intermediate space at least in a lateral direction, are entirely bridged by the first metal layer. Advantageously, the entire intermediate space has no point which is not covered by the first metal layer. Complete lateral coverage of the intermediate space by the first metal layer has a mechanically stabilizing effect on the component, such that the formation of a mechanical weak point, specifically at the location of the intermediate space, is substantially avoided. The first metal layer can thus be configured as a mechanically-stabilizing, and advantageously as a self-supporting layer of the component. In other words, the first metal layer can be configured as an independent layer which, even without the mechanical support of further layers, is mechanically stable in response to the action of gravity.

The first metal layer in this case is specifically configured continuously. For example, the first metal layer, in the vertical direction, has a thickness ranging from 5 μm to 50 μm inclusive. The thickness of the first metal layer advantageously ranges from 10 μm to 50 μm inclusive, for example from 10 μm to 30 μm inclusive. Such a configuration of the first metal layer ensures a sufficient mechanical stability of the component, even at the location of the intermediate space, or specifically at locations of the intermediate spaces between various subregions of the second metal layer. The first metal layer can thus entirely cover the through-connection or the recess in the semiconductor body.

According to at least one form of embodiment of the component, the first metal layer has at least one opening or a plurality of laterally spaced openings. For the electrical bonding of the second semiconductor layer, the second subregion of the second metal layer extends, for example, through the opening or openings. In an overhead view of the semiconductor body, the second subregion specifically overlaps with the first metal layer such that, for example, in combination, the first metal layer and the second subregion completely cover the active layer, specifically the entire semiconductor body.

The second metal layer can thus be configured as a mechanically-stabilizing layer of the component. Specifically, the second metal layer, in comparison with the first metal layer, has a greater thickness. For example, the thickness of the second metal layer ranges from 10 μm to 200 μm inclusive, for example from 10 μm to 100 μm, and specifically from 50 μm to 100 μm inclusive. Specifically, the thickness of the second metal layer is at least two times, for example four times or ten times greater than the thickness of the first metal layer. For example, the ratio of the thickness of the second metal layer to the thickness of the first metal layer ranges from 2 to 10 inclusive, for example from 5 to 10 inclusive.

By the complete lateral coverage of the active layer or of the entire semiconductor body by the first metal layer and the second subregion of the second metal layer, no region of the active layer or of the semiconductor body is left without mechanical support of the first or second metal layer. As a result, a higher manufacturing output is achieved. Specifically, damage to components associated with the mechanical loading of such components, in isolation, is prevented. Moreover, during subsequent processing steps, including the removal of the growth substrate, specifically by an etching or laser lift-off method, during soldering, assembly, conveyance or fitting, the robustness of the component is significantly improved.

According to at least one form of embodiment of the component, the second metal layer is laterally delimited by a molding, for example by an electrically-insulating sealing compound. The first subregion and the second subregion are advantageously embedded in the molding. For example, the first subregion and the second subregion respectively adjoin the molding on all sides in the lateral direction. The molding can be configured in one piece, i.e. continuously. The intermediate space is at least partially, and specifically completely filled by a material of the molding. The laterally spaced subregions of the second metal layer can therefore be held in position by the molding, thus forming, in combination with the molding, an exceptionally mechanically stable carrier for the component.

According to at least one configuration of the component, the first metal layer and the second metal layer are each a galvanically separated metal layer. Specifically, the metal layers are comprised of a metal, such as nickel, copper or other metals. The first metal layer and/or the second metal layer can be comprised of a first metal and at least one further material. The proportion of the first metal is specifically at least 90 atomic percent, for example at least 95 or 98 atomic percent of the first and/or the second metal layer. For example, the metal layers, in respect of their materials, are configured such that the first metal layer has a higher elastic modulus than the second metal layer and/or the second metal layer has a higher thermal conductivity than the first metal layer. For example, the first metal layer is formed of nickel, and the second metal layer of copper. Such a configuration of the metal layers reduces the overall height of the component, whilst maintaining sufficient mechanical stability of the component and a high efficiency of heat dissipation by the second metal layer.

According to at least one form of embodiment of the component, the latter incorporates a reflective layer. The reflective layer is arranged, for example, between the semiconductor body and the first metal layer. The reflective layer is specifically configured for electrical conductivity. During the application of the first metal layer by means of a galvanic method, the reflective layer can thus serve as a seed layer for the first metal layer to be applied. Specifically, the first metal directly adjoins the reflective layer. It is also possible for the first metal layer to be applied indirectly to the reflective layer. The first metal layer and the reflective layer can incorporate a common opening or a plurality of common openings, through which the second subregion extends. The reflective layer completely covers the active layer or the entire semiconductor body, specifically up to the common opening or the common openings. The reflective layer reflects, for example, the radiation generated during the operation of the component in the direction of the radiation-permeable surface of the component, thereby increasing the efficiency of the component.

According to at least one form of embodiment of the component, a current distribution layer is arranged between the semiconductor body and the first metal layer. The current distribution layer covers the common opening, specifically completely. The current distribution layer can also completely cover the intermediate space. The current distribution layer is configured for electrical conductivity and adjoins, for example, the second subregion of the second metal layer.

According to at least one form of embodiment of the component, an electrically-conductive bonding layer is arranged between the semiconductor body and the reflective layer.

Specifically, the bonding layer is configured for the reflection of radiation. In an overhead view, in combination with the reflective layer, the bonding layer can completely cover the active layer or the entire semiconductor body. The bonding layer specifically adjoins the semiconductor body, for example the second semiconductor layer, and is electrically connected to the second subregion of the second metal layer.

According to at least one form of embodiment of the component, the latter incorporates a diffusion barrier layer which is arranged, for example, between the semiconductor body and the current distribution layer. By means of the diffusion barrier layer, the migration of metal atoms or metal ions from the current distribution layer, the reflective layer or the metal layers to the bonding layer and the active layer, and the consequent damage thereof, can be prevented.

According to at least one form of embodiment of the component, the latter incorporates a first insulating layer, which specifically encloses the bonding layer, the diffusion barrier layer and the current distribution layer in the lateral direction. The first insulating layer thus extends in the vertical direction, for example only as far as the semiconductor body, and is configured as a passivating layer.

The component can incorporate a second insulating layer, which is specifically arranged between the semiconductor body and the reflective layer. Direct electrical contact between lateral edges of the semiconductor body and the reflective layer can thus be prevented. For example, in the lateral directions, the second insulating layer encloses the first insulating layer, the through-connection and, specifically over the full extent of at least one vertical dimension, the semiconductor body.

According to at least one form of embodiment of the component, the reflective layer incorporates at least one channel. The channel extends, for example, in the vertical direction through the reflective layer. Specifically, the channel runs edge-wise in the lateral direction, for example along at least one edge of the component. It is also possible for the reflective layer to be subdivided by the channel into two, or into a plurality of mutually-separated regions. For example, the channel extends from a first edge to a second edge, specifically lying opposite the first edge, of the reflective layer. By means of channel, the mechanical bonding to layers to be applied thereafter can be improved.

For example, the reflective layer can incorporate a plurality of channels—for example, two mutually spaced channels—which are arranged respectively in edge zones of the component. The edge zones are specifically zones positioned along the lateral edges of the component. The channels can thus enclose the edges of the component. For example, the mutually spaced channels form a frame, which specifically encloses the common opening or openings, or the through-connection. Specifically, the channels delimit the reflective layer in the lateral direction. This means that the entire reflective layer can be surrounded by the channels. For example, the reflective layer in this case is configured continuously. The channel or channels are specifically bridged or occupied by the first metal layer. For example, the channels are partially or completely filled by a material of the first metal layer.

According to at least one form of embodiment of the component, the latter incorporates an intermediate insulating layer. The intermediate insulating layer is arranged between the first and the second metal layer. The second subregion of the metal layer is, for example, electrically insulated from the first metal layer by the intermediate insulating layer. Specifically, the intermediate insulating layer and the first metal layer incorporate a common opening or a plurality of common openings, through which the second subregion extends. Moreover, the intermediate insulating layer can incorporate a further opening, through which the first subregion extends, for example, to the first metal layer. The first subregion of the second metal layer is specifically in direct electrical contact with the first metal layer.

According to at least one form of embodiment of the component, the latter is configured for electrical connection by means of the first subregion and the second subregion of the second metal layer, on its reverse side. In other words, the component, via a reverse side thereof which is averted from the radiation-permeable surface, can be connected to an external voltage source in an electrically-conductive manner. The radiation-permeable surface is thus specifically devoid of electrical contacts or conductors.

In one form of embodiment of a method for producing one or a plurality of the aforementioned components, the first metal layer and the second metal layer are precipitated respectively by a galvanic method. The first metal layer is specifically applied to an electrically-conductive reflective surface which is configured on the semiconductor body. For the formation of the through-connection, the reflective layer can at least partially or completely occupy the recess in the semiconductor body. The reflective layer is structured, or the application thereof is structured such that the latter incorporates at least one opening or a plurality of openings. The reflective layer in this case specifically serves as a seed layer for the application of the first metal layer. It is also possible for an electrically-conductive layer to be applied to the reflective layer, and for the first metal layer to be precipitated directly onto said electrically-conductive layer.

Following the application of the first metal layer, the intermediate insulating layer is applied, for example, to the first metal layer. Prior to the application of the second metal layer, an electrically-conductive layer can be applied directly to the intermediate insulating layer. The electrically-conductive layer is then specifically structured, or is partially covered with an electrically-insulating lacquer coating, such that the second metal layer, for example by means of a galvanic coating method, can be directly applied in a structured manner to the structured or partially-covered electrically-conductive layer.

Specifically, the second metal layer, with its first and second subregions on the intermediate insulating layer, is configured such that the second subregion, for the electrical bonding of the second semiconductor layer, extends through the opening or the plurality of openings in the reflective layer. The first subregion in this case, specifically in the region of a further opening in the intermediate insulating layer, adjoins the first metal layer, for example, and is electrically connected to the first semiconductor layer by means of the first metal layer, the reflective layer and the through-connection.

The method is particularly appropriate for the manufacture of an aforementioned component. Consequently, the characteristics described with reference to the component can also be considered with respect to the method, and vice versa.

BRIEF DESCRIPTION OF THE DRAWING(S)

Further advantages, preferred forms of embodiment and further developments of the component proceed from the embodiments, which are described hereinafter with reference to FIGS. 1 to 4.

In the drawings, like reference characters generally refer to the same parts throughout the different views. The drawings are not necessarily to scale, emphasis instead generally being placed upon illustrating the principles of the disclosed embodiments. In the following description, various embodiments described with reference to the following drawings, in which.

DETAILED DESCRIPTION

Identical or equivalent elements, or those having the same function, are identified by the same reference numbers in the figures. In each case, the figures are schematic representations and, in consequence, are not necessarily true to scale. Rather, in the interests of clarity, comparatively small elements, and specifically layer thicknesses, are represented over-scale.

Figure 1:
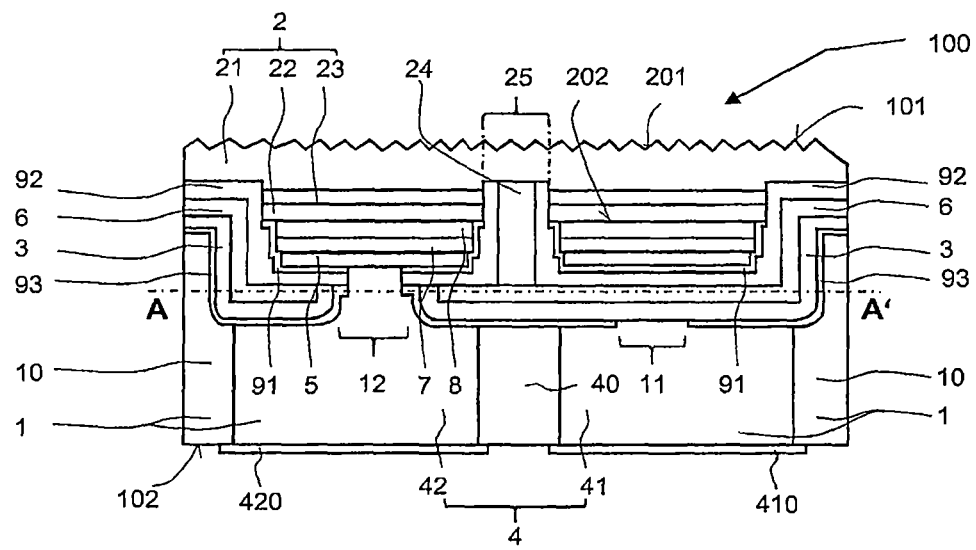
FIG. 1 shows a schematic representation of an embodiment of a component.

A first embodiment of a component is schematically represented in FIG. 1. The component 100 has a carrier 1, and a semiconductor body 2 arranged on the carrier. The semiconductor body 2 has a first semiconductor layer 21, a second semiconductor layer 22, and an active layer 23 arranged between the first and the second semiconductor layers. The first semiconductor layer 21, the second semiconductor layer 22 and the active layer 23 can respectively be comprised of one or a plurality of doped or undoped layers. The active layer 23 is specifically a p-n-transition zone of the semiconductor body. Specifically, the semiconductor body incorporates a III-V- or II-VI-semiconductor material, or is comprised of the latter. For example, the first semiconductor layer and/or the second semiconductor layer include a GaN-, a GaP- or a GaAs-layer.

These layers can additionally incorporate aluminum and/or indium and are configured, for example, as an AlGaN-, InAlGaN- or InAlGaP-layer. The first semiconductor layer 21 and the second semiconductor layer 22 can, for example, be configured as an n-type and p-type conductor respectively, or vice versa. For example, the second semiconductor layer 22 is configured as a p-type conductor.

The component has a radiation-permeable surface 101 and a reverse side 102 which is averted from the radiation-permeable surface. The radiation-permeable surface 101 has a structured configuration. Specifically, the radiation-permeable surface 101 is configured by a first main surface 201 of the semiconductor body 2, for example by a surface of the first semiconductor layer 21. It is also possible for the radiation-permeable surface 101 to be configured as a surface of a radiation-permeable layer which is arranged on the first semiconductor layer 21. Specifically, the component 100 is electrically-contactable, externally, via the reverse side 102. The component 100 can thus be configured as a surface-mountable component.

In FIG. 1, a bonding layer 8, a diffusion barrier layer 7, a current distribution layer 5, a first insulating layer 91, a second insulating layer 92, a reflective layer 6, a first metal layer 3 and an intermediate insulating layer 93 are arranged in the sequence indicated, at least in places, between the semiconductor body 2 and the carrier 1.

The carrier 1 has a second metal layer 4. The second metal layer includes a first subregion 41 and a second subregion 42, which is laterally spaced from the first subregion 41. An intermediate space 40 is configured between the first subregion 41 and the second subregion 42, such that the first subregion 41 is electrically isolated from the second subregion 42.

The carrier 1 further includes a molding 10. The molding 10 is specifically configured as an electrical insulator. For example, the molding 10 is configured as a sealing compound. The second metal layer 4, with the first subregion 41 and the second subregion 42, is enclosed by the molding 10, specifically in the lateral direction, over its full perimeter. The first subregion 41 and the second subregion 42 thus adjoin the molding 10, specifically in lateral directions. The intermediate space 40 is, for example, completely filled with an electrically-insulating material of the molding. The subregions 41 and 42 of the second metal layer 4 are specifically held in a mutually mechanically stable position by the molding 10. In the lateral direction, the second metal layer 4 specifically does not extend to the edge of the component 100 and, in the lateral directions, is specifically fully-embedded in the molding 10. In the lateral direction, the molding 10 terminates, for example, at the first semiconductor layer 21 of the semiconductor body 2. Such a configuration of the molding 10 improves the mechanical integrity of the second metal layer 4.

The first metal layer 3 is arranged between the semiconductor body 2 and the second metal layer 4. In an overhead view, the first metal layer 3 completely covers the intermediate space 40. Specifically, the first metal layer 3 is configured as a mechanically-stabilizing layer of the component. The first metal layer 3 in this case has a vertical thickness of at least 5 µm, and specifically at least 10 µm. For example, the thickness of the first metal layer 3 ranges from 5 µm to 30 µm inclusive, for example from 5 µm to 15 µm or from 10 µm to 20 µm. As a result of the complete coverage of the intermediate space 40 by the first metal layer 3, the component is devoid of mechanical weak points in the regions of the intermediate space. Specifically, the first metal layer 3 is configured continuously. In the lateral direction, the first metal layer 3 specifically extends to the edge of the component. In FIG. 1, the first metal layer 3, in the lateral direction, terminates in a flush-fitting to the molding 10 and the first semiconductor layer 21.

The first metal layer 3 has an opening 12, through which the second subregion 42 extends for the electrical bonding of the second semiconductor layer 22. It is also possible for the first metal layer 3 to incorporate a plurality of such openings 12. In an overhead view, in combination with the first metal layer 3, the second subregion 42 of the second metal layer 4 completely covers the active layer 23, and specifically the entire semiconductor body 2. The second metal layer 4 is likewise specifically configured as a mechanically-stabilizing layer of the component. Specifically, the second metal layer 4, for example in the region of the first subregion 41, has a vertical thickness which, for example, is at least exactly equal to, or is advantageously at least two times, for example four times or ten times as great as the thickness of the first metal layer 3. By means of the complete coverage of the active layer 23 or the entire semiconductor body 1, specifically no region of the active layer 23 or of the semiconductor body 2 is devoid of mechanical support provided by the mechanically-stabilizing metal layers 3 and 4, such that the component has an exceptionally mechanically stable configuration.

The first metal layer 3 and the second metal layer 4 can each be a galvanically-precipitated metal layer. They can be formed of the same metal, for example nickel or copper. Specifically, they can also be comprised of different materials. For example, the first metal layer 3 has a higher elastic modulus than the second metal layer, wherein the second metal layer 4 has a higher thermal conductivity than the first metal layer. For example, the first metal layer 3 is comprised of nickel, and the second metal layer 4 of copper.

An intermediate insulating layer 93 is arranged between the first metal layer 3 and the second metal layer 4. By means of the intermediate insulating layer 93, the first metal layer 3 is electrically insulated from the second subregion 42 of the second metal layer 4. The intermediate insulating layer 93 in this case can be configured continuously. It is possible for a bonding layer (not represented) to be arranged between the first metal layer 3 and the intermediate insulating layer 93. This bonding layer can be applied to the first metal layer 3 by a coating method, for example by vapor deposition. Specifically, the bonding layer is comprised of titanium or chromium. By means of the bonding layer, a high degree of mechanical stability can be achieved between the bonding layer and the intermediate insulating layer 93.

The intermediate insulating layer 93 and the first metal layer 3 have a common opening, through which the second subregion 42 extends. The intermediate insulating layer 93 moreover incorporates at least one further opening 11, through which the first subregion 41 of the second metal layer 4 extends to the first metal layer 3. In the region of the further opening 11, the first metal layer 3 and the first subregion 41 of the second metal layer 4, for example, are in direct electrical contact.

Specifically, the second metal layer 4 is a galvanically-separated metal layer applied to the intermediate insulating layer 93. Prior to the application of the second metal layer 4, an electrically-conductive layer (not represented in FIG. 1) can be applied directly to the intermediate insulating layer 93. This electrically-conductive layer can be structured thereafter, and specifically serves as a seed layer for the second metal layer 4, which can be applied, for example, by means of a galvanic coating method.

In FIG. 1, the reflective layer 6 is arranged between the semiconductor body 2 and the first metal layer 3. In an overhead view of the semiconductor body 2, the metal layer 3 covers the reflective layer 6, specifically completely. Specifically, the first metal layer 3 directly adjoins the reflective layer 6. The reflective layer 6 is configured, for example, as an electrically-conductive layer. The reflective layer 6 can serve as a seed layer for the application of the first metal layer 3, by means of a galvanic method.

The reflective layer 6 is comprised, for example, of a metal. For example, the reflective layer 6 contains aluminum, rhodium, palladium, silver or gold. During the operation of the component 100, the reflective layer 6 reflects electromagnetic radiation in the direction of the radiation-permeable surface 101. Specifically, the reflective layer 6 reflects a minimum proportion of 60%, wherein a minimum of 80% is preferred, and a minimum of 90% is specifically preferred, of the spectrum of the radiation generated by the active layer 23 during the operation of the component. In FIG. 1, the reflective layer 6 extends in the lateral direction to the edge of the component. Alternatively, it is also possible for the entire reflective layer 6 to be surrounded in the lateral direction over its full perimeter, specifically by the intermediate insulating layer 93. The reflective layer 6 can thus be protected against environmental influences, such as humidity or oxygen.

The reflective layer 6, the first metal layer 3 and the intermediate insulating layer 93 have a common opening 12, through which the second subregion 42 of the second metal layer extends. In FIG. 1, the second subregion 42 adjoins the current distribution layer 5, which is arranged between the semiconductor body 2 and the reflective layer 6. The current distribution layer 5 in this case completely covers the common opening 12. Specifically, the current distribution layer 5 is a further metal layer which, in addition to the first and the second metal layers 3 and 4, further stabilizes the component 100. However, it is also conceivable that the current distribution layer 5 can be omitted.

The diffusion barrier layer 7 is arranged between the semiconductor body 2 and the current distribution layer 5. This layer specifically prevents the migration of metal atoms or metal ions from the current distribution layer 5, the reflective layer 6, the first metal layer 3 or the second metal layer 4 to the bonding layer 8 or the active layer 23 of the semiconductor body, thus preventing any damage thereto.

The bonding layer 8 is arranged between the semiconductor body 2 and the diffusion barrier layer 7. The bonding layer 8 is, for example, electrically conductive, and is specifically configured for the reflection of radiation. In an overhead view of the semiconductor body 2, the reflective layer 6 and the bonding layer 8, in combination, completely cover the active layer 23. Such a configuration of the reflective layer 6 and the bonding layer 8 enhances the radiation decoupling efficiency of the component.

The component has a first insulating layer 91 and a second insulating layer 92, which adjoins the first insulating layer 91. The first insulating layer 91 encloses the bonding layer 8, the diffusion barrier layer 7 and the current distribution layer 5, in lateral directions, specifically over their full perimeter. In the vertical direction, the first insulating layer 91 only extends between the reflective layer 6 and the semiconductor body 2. The second insulating layer 92 extends in the vertical direction from the reflective layer 6 at least to the first semiconductor layer 21. The reflective layer 6 and the second insulating layer 92, at the edge of the component, are provided with a step, and are configured such that the semiconductor body 2 is laterally enclosed, in areas, by the reflective layer 6 and the second insulating layer 92.

Radiation emitted laterally to the reverse side 102 of the component can thus be reflected back by the reflective layer 6 in the direction of the radiation-permeable surface 101. The second insulating layer 92 is thus specifically configured as radiation-permeable.

The semiconductor body 2 has a recess 25. The recess 25 extends from the second main surface 202 of the semiconductor body 2, through the second semiconductor layer 22 and the active layer 23, to the first semiconductor layer 21. A through-connection 24 is configured in the recess 25. The through-connection 24, in the lateral direction, is specifically enclosed by the second insulating layer 92 over its full perimeter. The through-connection 24 is comprised of a metal. Specifically, the through-connection 24 and the reflective layer 6 are comprised of the same electrically-conductive material. Specifically, the through-connection 24 is in direct electrical contact with the reflective layer 6. The through-connection 24 is electrically connected to the first subregion 41 of the second metal layer 4 by means of the reflective layer 6 and the first metal layer 3. The through-connection 24 adjoins the first semiconductor layer 21, whether indirectly or directly and, in the lateral direction, is specifically enclosed by the semiconductor body 2 over its full perimeter. In an overhead view of the semiconductor body 2, the first metal layer 3 completely covers the recess 25 and the through-connection 24. It is also possible for the component to be provided with a plurality of through-connections 24 for the electrical bonding of the first semiconductor layer 21, as a result of which an exceptionally uniform current distribution is achieved within the first semiconductor layer 21.

The component 100 is configured for electrical connection via the rear side 102, i.e. for rear-side connection. The component 100 can thus be electrically connected via the first subregion 41 and the second subregion 42 to an external voltage source.

The semiconductor body 2 in this case completely covers the first and second subregions 41 and 42 of the second metal layer 4. In FIG. 1, the component 100, on its reverse side 102, has a first contact layer 410, which is in direct electrical contact with the first subregion 41, and a second contact layer 420, which is in direct electrical contact with the second subregion of the second metal layer 4. In an overhead view of the carrier 1, the semiconductor body 2 completely covers the first and the second contact layers 410 and 420. In an overhead view of the semiconductor body 2, the contact layers 410 and 420 completely cover the first subregion 41 and the second subregion 42, or specifically project beyond said subregions 41 and 42 respectively. The first contact layer 410 is specifically configured as a n-type contact layer, and the second contact layer 420, for example, as a p-type contact layer.

Figure 2:
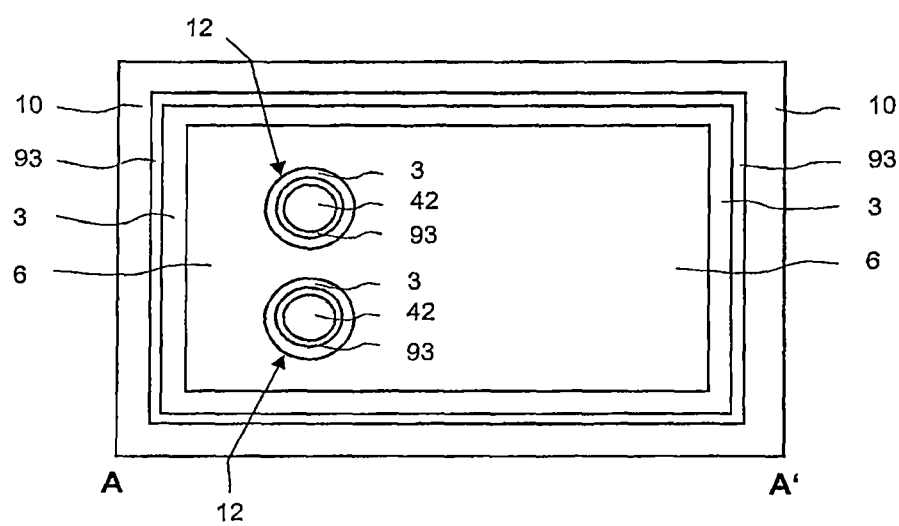
FIG. 2 shows a schematic representation of a lateral section of the embodiment of a component.

FIG. 2 shows a lateral section of the component 100 along a line marked as AA' in FIG. 1.

The component 100 has two openings 12, through which the second subregion 42 of the second metal layer 4 extends for the electrical connection of the second semiconductor layer 22. Alternatively, the component can be configured with a plurality of such openings 12. In the openings 12, the second subregion 42, in the lateral direction, is enclosed by the intermediate insulating layer 93 and the reflective layer 6 over its entire perimeter. The reflective layer 6, the first metal layer 3 and the intermediate insulating layer 93 are each configured continuously, and are provided with the common openings 12. The reflective layer 6, the first metal layer 3 and the intermediate insulating layer 93, as represented in FIG. 2, at least in the vertical direction AA', are each enclosed in the lateral directions by the molding 10 over their full perimeter.

Figure 3:
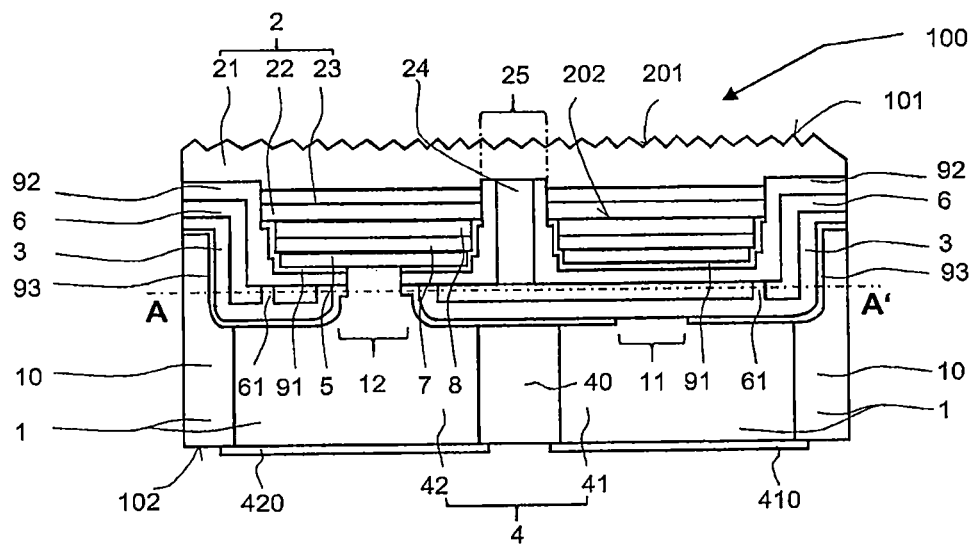
FIG. 3 shows a schematic representation of a further embodiment of a component.

FIG. 3 shows a schematic sectional representation of a further embodiment of a component 100. This embodiment essentially corresponds to the embodiment of a component represented in FIG. 1. It differs from the latter in that the reflective layer 6, in the vicinity of the opening 12, is provided with at least one channel 61. The channel 61 extends in the vertical direction through the reflective layer 6. Specifically, the channel 61 runs in the lateral direction along at least one edge of the component 100.

Specifically, the channel 61 is partially occupied, and specifically is fully occupied by a material of the first metal layer 3. The channel 61 in this case has a width, specifically between 3 µm and 15 µm, for example between 5 µm and 10 µm. Upon the application of the first metal layer 3 to the reflective layer 6, the channel 61 can be bridged or completely occupied by the first metal layer 3. The channel 61 can be only partially filled by a material of the first metal layer 3. It is also possible for the reflective layer to be provided with a plurality of mutually spaced channels 61, each of which is bridged or occupied by the first metal layer 3.

Figure 4:
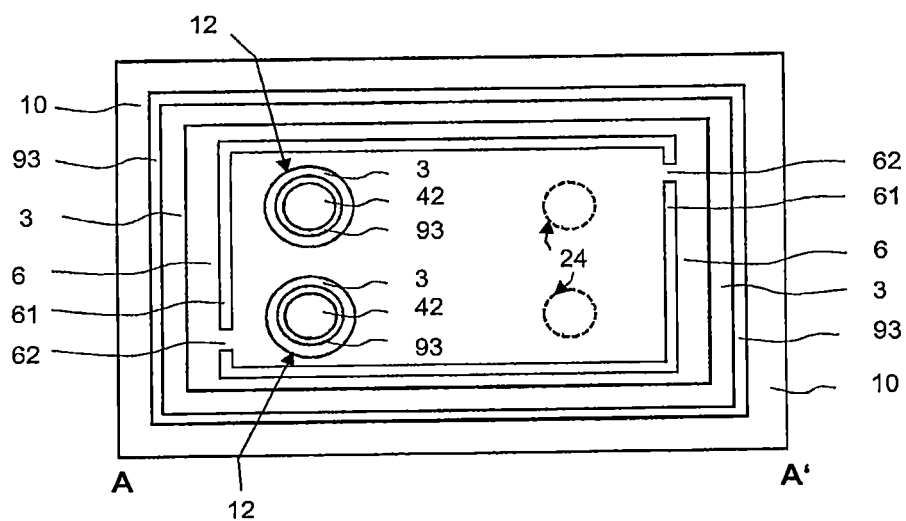
FIG. 4 shows a schematic representation of a lateral section of the further embodiment of a component.

FIG. 4 shows a schematic representation of a lateral section of the further embodiment of a component represented in FIG. 3. This embodiment essentially corresponds to the embodiment of a component represented in FIG. 2.

It differs from the latter in that the reflective layer 6 is provided with a plurality of mutually spaced channels 61. The channels 61 are arranged respectively in edge regions of the component 100. The channels 61 in this case form a frame with connecting points 62, wherein the frame encloses the common opening 12 and the through-connection 24, or the common openings 12 and the through-connections 24. The one-piece, i.e. continuous configuration of the reflective layer 6 is maintained through the connecting points 62. The entire reflective layer 6 in this case, even in the presence of the channels 61, can serve as a seed layer for the application of the first metal layer 3, for example by means of a galvanic method. The channels 61 in this case are bridged by the first metal layer 3, and are partially or completely occupied by a material of the metal layer 3.

It is also possible for the reflective layer 6 to be subdivided by one or a plurality of channels 61 into two or more mutually-separated regions. In such cases, the reflective layer 6 can be coated with an electrically-conductive layer, which electrically connects various regions of the reflective layer 6. Moreover, it is also possible for the channels 61 to form a frame which delimits the reflective layer 6, specifically in the lateral direction. This means that the entire reflective layer can be enclosed by the channels 61. The electrically-conductive layer can be applied to the reflective layer 6, wherein the electrically-conductive layer, for example, also covers regions which lie outside the frame formed by the channels 61. If the conductive layer covers no regions which lie outside the reflective layer 6, the reflective layer 6 and the first metal layer 3 can be entirely laterally enclosed by the intermediate insulating layer 93. The first metal layer 3 can thus be galvanically applied to the reflective layer 6, and specifically galvanically applied directly to the electrically-conductive layer.

By the employment of the second metal layer with the first subregion, and the second subregion, which is laterally spaced from the first subregion, on the reverse side of the component, the component can be mechanically stabilized, and these subregions can simultaneously provide external electrical contact for the component. By the application of the first metal layer, which is configured as a mechanically-stabilizing layer of the component and completely covers an intermediate space between the first subregion and the second subregion, the component is devoid of mechanical weak points, even in the regions of the intermediate space. Consequently, no region of the component is devoid of mechanical support delivered by the metal layer and the further metal layer, such that the component has an exceptionally mechanically stable configuration.

While the disclosed embodiments have been particularly shown and described with reference to specific embodiments, it should be understood by those skilled in the art that various changes in form and detail may be made therein without departing from the spirit and scope of the disclosed embodiments as defined by the appended claims. The scope of the disclosed embodiments is thus indicated by the appended claims and all changes which come within the meaning and range of equivalency of the claims are therefore intended to be embraced.

The invention claimed is:

1. A component having a semiconductor body, a first metal layer and a second metal layer, wherein
the first metal layer is arranged between the semiconductor body and the second metal layer,
the semiconductor body has a first semiconductor layer on a side which is averted from the first metal layer, a second semiconductor layer on a side facing towards the first metal layer, and an active layer arranged between the first semiconductor layer and the second semiconductor layer,
the component has a through-connection, which extends through the second semiconductor layer and the active layer for the electrical bonding of the first semiconductor layer,
the second metal layer has a first subregion, and a second subregion, spaced apart laterally from the first subregion by an intermediate space, wherein the first subregion is electrically connected to the through-connection by means of the first metal layer, and
in an overhead view, the first metal layer laterally completely covers the intermediate space,
wherein the second metal layer is laterally delimited by an electrically-insulating molding,
the first subregion and the second subregion adjoin the molding in lateral directions, and
the intermediate space is filled with an electrically-insulating material of the molding.

2. The component as claimed in claim 1,
wherein the molding is configured continuously.

3. The component as claimed in claim 1,
wherein the molding and the second metal layer with the first subregion and the second subregion form a carrier of the component,
wherein the laterally spaced subregions and are held in position by the molding.

4. The component as claimed in claim 1, wherein the first metal layer is configured as a mechanically-stabilizing layer of the component.

5. The component as claimed in claim 1, wherein the first metal layer is configured continuously, and has a thickness ranging from 5 µm to 50 µm inclusive.

6. The component as claimed in claim 1, wherein the first metal layer and the second subregion, in combination, cover at least 90% of the total surface area of the active layer.

7. The component as claimed in claim 1, wherein the first metal layer and/or the second metal layer are comprised of a first metal and at least one further material, wherein a proportion of the first metal is at least 90 atomic percent of the first or the second metal layer.

8. The component as claimed in claim 1, wherein the first metal layer has a higher elastic modulus than the second metal layer and/or the second metal layer has a higher thermal conductivity than the first metal layer.

9. The component as claimed in claim 1, wherein the first metal layer has at least one opening, through which the second subregion extends for the electrical bonding of the second semiconductor layer.

10. The component as claimed in claim 1, wherein a reflective layer is arranged between the semiconductor body and the first metal layer, and wherein the first metal layer and the reflective layer incorporate a common opening.

11. The component as claimed in claim 10,
wherein the reflective layer incorporates a channel, which extends in the vertical direction through the reflective layer, and runs edge-wise in the lateral direction along the component.

12. The component as claimed in claim 11, wherein the reflective layer incorporates at least two mutually spaced channels, which enclose the edges of the component, and at least in some regions enclose the common opening and the through-connection, wherein the reflective layer is configured continuously, and the channels are bridged or occupied by the first metal layer.

13. The component as claimed in claim 1, wherein an intermediate insulating layer with an opening and a further opening is arranged between the first metal layer and the second metal layer, wherein the first subregion extends through the further opening, and the second subregion extends through the opening.

14. The component as claimed in claim 1, wherein the component is configured for electrical connection by means of the first subregion and the second subregion on a side of the second metal layer which is averted from the first metal layer.

15. The component as claimed in claim 1, wherein the active layer, during the operation of the component, emits electromagnetic radiation in the visible, ultraviolet or infrared spectral range.

16. The component as claimed in claim 1, wherein the component is devoid of a growth substrate.

17. A method for the production of a component as claimed in claim 1, wherein the semiconductor body is provided, and the first metal layer and the second metal layer are applied respectively by a galvanic coating method, wherein
an electrically-conductive reflective layer is configured on the semiconductor body, wherein the reflective layer incorporates at least one opening or a plurality of openings,
the first metal layer is galvanically applied to the reflective layer,
an intermediate insulating layer is applied to the first metal layer, and
the second metal layer with the first and second subregions is configured on the intermediate insulating layer, wherein the second subregion extends through the opening or the plurality of openings for the electrical bonding of the second semiconductor layer.

18. The method as claimed in claim 17, wherein, prior to the application of the second metal layer, an electrically-conductive layer is applied to the intermediate insulating layer and is structured thereafter, and the second metal layer is galvanically applied directly to the electrically-conductive layer.

19. A component having a semiconductor body, a first metal layer and a second metal layer, wherein
the first metal layer is arranged between the semiconductor body and the second metal layer,
the semiconductor body has a first semiconductor layer on a side which is averted from the first metal layer, a second semiconductor layer on a side facing towards the first metal layer, and an active layer arranged between the first semiconductor layer and the second semiconductor layer,
the component has a through-connection, which extends through the second semiconductor layer and the active layer for the electrical bonding of the first semiconductor layer, the second metal layer has a first subregion, and a second subregion, spaced apart laterally from the first subregion by an intermediate space, wherein the first subregion is electrically connected to the through-connection by means of the first metal layer, and in an overhead view, the first metal layer laterally completely covers the intermediate space, wherein the first metal layer has a higher elastic modulus than the second metal layer and/or the second metal layer has a higher thermal conductivity than the first metal layer.

20. A component having a semiconductor body, a first metal layer and a second metal layer, wherein the first metal layer is arranged between the semiconductor body and the second metal layer, the semiconductor body has a first semiconductor layer on a side which is averted from the first metal layer, a second semiconductor layer on a side facing towards the first metal layer, and an active layer arranged between the first semiconductor layer and the second semiconductor layer, the component has a through-connection, which extends through the second semiconductor layer and the active layer for the electrical bonding of the first semiconductor layer, the second metal layer has a first subregion, and a second subregion, spaced apart laterally from the first subregion by an intermediate space, wherein the first subregion is electrically connected to the through-connection by means of the first metal layer, and in an overhead view, the first metal layer laterally completely covers the intermediate space, wherein a reflective layer is arranged between the semiconductor body and the first metal layer, wherein the first metal layer and the reflective layer incorporate a common opening, and wherein the reflective layer incorporates a channel, which extends in the vertical direction through the reflective layer, and runs edgewise in the lateral direction along the component.

21. A component having a semiconductor body, a first metal layer and a second metal layer, wherein the first metal layer is arranged between the semiconductor body and the second metal layer, the semiconductor body has a first semiconductor layer on a side which is averted from the first metal layer, a second semiconductor layer on a side facing towards the first metal layer, and an active layer arranged between the first semiconductor layer and the second semiconductor layer, the component has a through-connection, which extends through the second semiconductor layer and the active layer for the electrical bonding of the first semiconductor layer, the second metal layer has a first subregion, and a second subregion, spaced apart laterally from the first subregion by an intermediate space, wherein the first subregion is electrically connected to the through-connection by means of the first metal layer, and in an overhead view, the first metal layer laterally completely covers the intermediate space, wherein a reflective layer is arranged between the semiconductor body and the first metal layer, wherein the first metal layer and the reflective layer incorporate a common opening, and wherein the reflective layer incorporates at least two mutually spaced channels, which enclose the edges of the component, and at least in some regions enclose the common opening and the through-connection, wherein the reflective layer is configured continuously, and the channels are bridged or occupied by the first metal layer.

* * * * *